US008897057B2

(12) United States Patent
Skold et al.

(10) Patent No.: US 8,897,057 B2
(45) Date of Patent: Nov. 25, 2014

(54) QUANTUM MEMORY

(75) Inventors: Niklas Adam Bilbo Skold, Cambridge (GB); Anthony John Bennett, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 13/561,843

(22) Filed: Jul. 30, 2012

(65) Prior Publication Data

US 2013/0107617 A1    May 2, 2013

(30) Foreign Application Priority Data

Oct. 28, 2011    (GB) .................................. 1118764.8

(51) Int. Cl.
*G11C 11/00*    (2006.01)
*G11C 11/14*    (2006.01)

(52) U.S. Cl.
CPC ...................... *G11C 11/14* (2013.01)
USPC ......................................................... 365/129

(58) Field of Classification Search
USPC ......... 365/106, 129, 158, 161–163, 171, 200; 977/708, 773, 774, 933
See application file for complete search history.

(56) References Cited

U.S. PATENT DOCUMENTS

| | | | | |
|---|---|---|---|---|
| 5,440,148 | A * | 8/1995 | Nomoto | 257/21 |
| 5,663,571 | A * | 9/1997 | Ugajin | 257/17 |
| 5,923,046 | A * | 7/1999 | Tezuka et al. | 257/24 |
| 6,026,013 | A * | 2/2000 | Peterson | 365/175 |
| 6,118,686 | A * | 9/2000 | Taira et al. | 365/129 |
| 8,288,754 | B2 * | 10/2012 | Bidal et al. | 257/9 |
| 2011/0006280 | A1 * | 1/2011 | Bidal et al. | 257/9 |

FOREIGN PATENT DOCUMENTS

| | | |
|---|---|---|
| GB | 2 439 595 A | 1/2008 |
| GB | 2479162 A | 10/2011 |
| JP | 2007-335503 A | 12/2007 |
| JP | 2011-209725 A | 10/2011 |
| WO | WO 2007/014483 A1 | 2/2007 |

OTHER PUBLICATIONS

Office Action issued Dec. 17, 2013, in Japanese Patent Application No. 2012-189828 with English translation.
Search Report issued Mar. 23, 2012 in United Kingdom Patent Application No. GB1118764.8.

(Continued)

*Primary Examiner* — Harry W Byrne
(74) *Attorney, Agent, or Firm* — Oblon, Spivak, McClelland, Maier & Neustadt, L.L.P.

(57) ABSTRACT

A quantum memory component including a quantum dot molecule having first and second quantum dots provided in respective first and second layers separated by a barrier layer; an exciton comprising an electron and hole bound state in said quantum dot molecule, the spin state of said exciton forming a qubit; first and second electrical contacts respectively provided below the first quantum dot and above the second quantum dot; a voltage source to apply an electric field across said quantum dot molecule; a controller to modulate the electric field across the quantum dot molecule, including an information acquiring circuit to acquire information concerning the relationship between fine structure splitting of the exciton and the applied electric field and a timing circuit to allow switching of the exciton from an indirect configuration to a direct configuration at predetermined times derived from the fine structure splitting.

20 Claims, 9 Drawing Sheets

(56) References Cited

OTHER PUBLICATIONS

G. Ortner, et al., "Electric field control of exciton states in quantum dot molecules", Physica E, vol. 21, No. 2-4, Mar. 2004, pp. 171-174.

Kushal C. Wijesundara, et al., "Spin effects of charged exciton states in electric field tunable quantum dot molecules", Conf. Proc. 2011 11th IEEE International Conference on Nanotechnology, Aug. 15-18, 2011, pp. 887-890.

M. Hagn, et al., "Electric-Field-Induced Exciton Transport in Coupled Quantum Well Structures", Solid-State Electronics, vol. 40, Nos. 1-8, 1996, pp. 429-431.

Hanz Y. Ramirez, et al., "Tunneling Effects on Fine-Structure Splitting in Quantum-Dot Molecules", Physical Review Letters, 104, 206402, 2010, pp. 206402-1-206402-4.

* cited by examiner

QUANTUM MEMORY

FIELD

Embodiments as described herein relate to the field of quantum memory and quantum information processing.

BACKGROUND

Several applications in quantum information processing, such as quantum repeaters and quantum networks, require the quantum state of a photon to be mapped onto a stable quantum memory in a reversible manner.

A semiconductor quantum dot functions as an effective quantum interface between light and matter where the polarisation of a single photon can be transcribed into the spin-state of a photogenerated exciton with high fidelity. The exciton has two spin eigenstates which correspond to two orthogonal photon polarisations, these spin eigenstates are separated in energy by the so called fine-structure splitting. The exciton can be initialised in one of the two spin eigenstates or in any superposition of these states. Thus, the exciton can be seen as a qubit.

DETAILED DESCRIPTION

Figure 1:
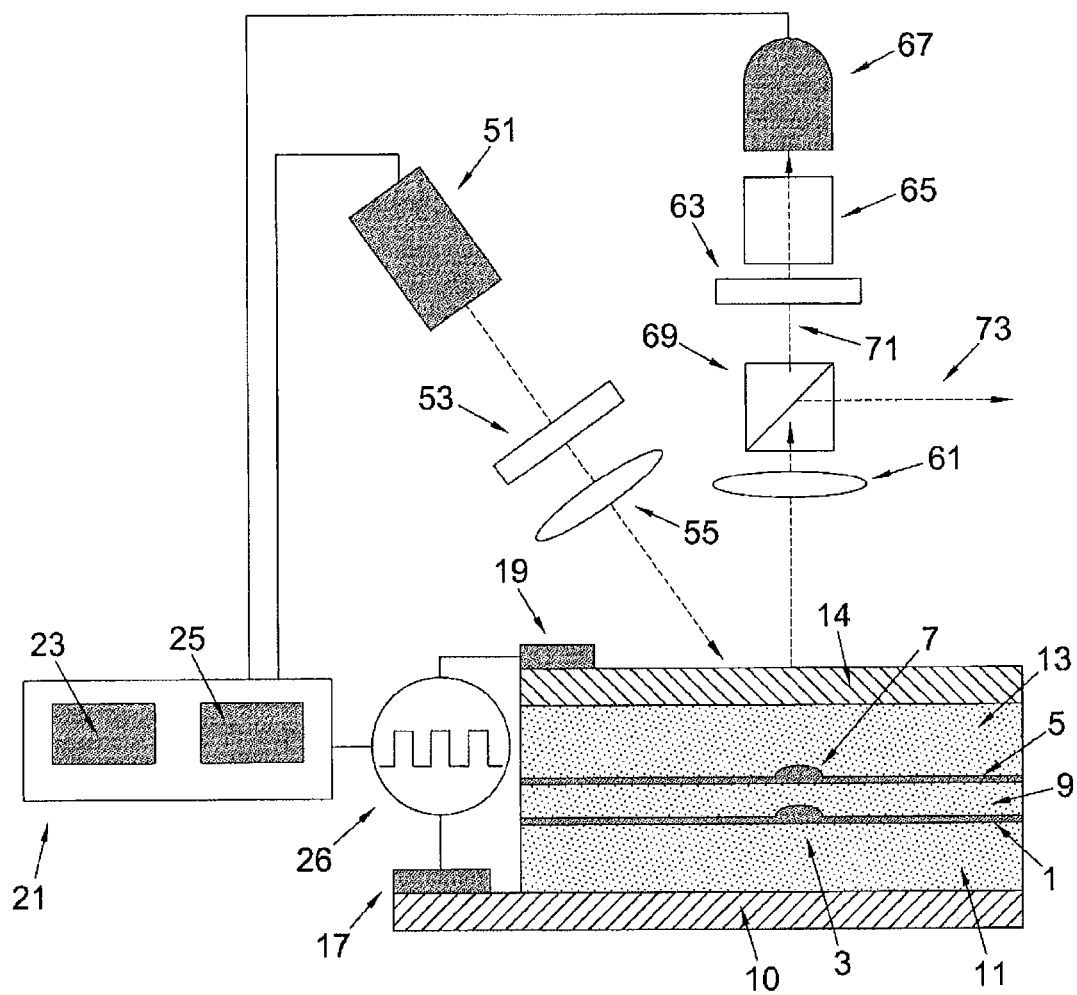
FIG. 1 is a schematic of a memory component in accordance with an embodiment of the present invention.

In an embodiment, a component of a memory is provided configured to store and manipulate a qubit state, said component comprising:

a quantum dot molecule, said molecule comprising a first quantum dot provided in a first layer and a second quantum dot provided in a second layer, the first and second layers being separated by a barrier layer, the second layer being arranged above the first layer;

an exciton comprising an electron and hole bound state in said quantum dot molecule, the spin state of said exciton forming said qubit;

a first electrical contact being provided below the first quantum dot and a second electrical contact being provided above the second quantum dot to allow an electric field to be provided across said quantum dot molecule;

a voltage source connected to the electrical contacts configured to apply an electric field across said quantum dot molecule, a voltage source controller configured to modulate the electric field across the quantum dot molecule such that an exciton in the quantum dot molecule is switched between a direct configuration where the electron and hole of the exciton are in the same quantum dot and an indirect configuration wherein the electron and hole are located in different quantum dots of the quantum dot molecule, the voltage source controller comprising an information acquiring circuit and a timing circuit, the information acquiring circuit being configured to acquire information concerning the relationship between the fine structure splitting of said exciton and the applied electric field, the timing circuit being configured to allow switching of the exciton from an indirect configuration to a direct configuration at predetermined times derived from the fine structure splitting.

The voltage controller knows, via the acquiring circuit, how the fine structure splitting of the exciton relates to the applied electric field. The fine structure splitting is here defined as the energy separation between the two exciton spin states that couple to light. In one embodiment the acquiring circuit is connected to a memory which contains data relating the fine structure splitting to the applied electric field. In further embodiments, the acquiring circuit may retrieve this information wirelessly.

The data acquired by the acquiring circuit may be data from measurements performed on the quantum dot molecule prior to operation.

In an embodiment, said voltage source controller is configured so that;

An electric field adapted for qubit initialisation is applied when the exciton is created, at this electric field the lowest energy exciton state corresponds to the direct exciton configuration which has a short lifetime and wherein both the electron and hole are confined in the same quantum dot, An electric field adapted for qubit storage is applied immediately after the exciton has been initialised, at this electric field the lowest energy exciton state corresponds to the indirect exciton configuration which has a long lifetime and wherein the electron and hole are confined in different quantum dots, during the switching of the electric field the exciton configuration changes from direct to indirect, An electric field adapted for qubit readout is applied when the quantum information stored in the spin state of the exciton is to be retrieved, at this electric field the lowest energy exciton state corresponds to the direct exciton configuration which has a short lifetime and wherein both the electron and hole are confined in the same quantum dot, during the switching of the electric field the exciton configuration changes from indirect to direct.

When a state is stored in a quantum dot molecule in either a direct or indirect configuration, the state will evolve over time. The evolution of the state over time is predictable. In an embodiment, the state in which the exciton is created is a superposition of two eigenstates. Two eigenstates can be visualised as two opposing poles on a so-called Bloch Sphere with an axis running between the poles. Over time, the state will precess on the Bloch sphere around the axis connecting the two eigenstates. The speed of this precession is controlled by the fine structure splitting.

Thus, once the fine structure splitting for a particular voltage is known, the evolution of the state is known. This allows control over the state which is read-out.

In an embodiment, the exciton is created by optical excitation. An exciton with a given spin state may be created by optically exciting the quantum dot molecule with a known polarisation. In a further embodiment, the component further comprising an optical source, said optical source being configured to optically excite an exciton of known spin state in said quantum dot molecule.

In a further embodiment, the optical source is configured to have a photon energy which is an integer number of phonon energies greater than the lowest energy exciton state at the electric field adapted for qubit initialisation. This reduces the probability of spin flips as the exciton relaxes to the lowest energy state.

In a further embodiment, the optical source is configured to have a photon energy which equal to the lowest energy exciton state at the electric field adapted for qubit initialisation. This minimises the probability of spin flips as the exciton relaxes to the lowest energy state.

In an embodiment, said quantum dot molecule is located in an optical cavity in order to improve the efficiency with which an exciton can be initialised. This is done by matching the optical mode of the cavity to the light pulse from the optical source both in terms of frequency and spatial shape. Furthermore, the quantum dot molecule is positioned in an anti-node of the cavity.

In an embodiment, the state is read out by moving the exciton from the storage configuration to the readout configuration by changing the electric field across the quantum dot molecule. In the readout configuration, the exciton in its direct configuration will recombine and emit a photon. The polarisation of the photon is a direct transcription of the exciton spin state. In a further embodiment, the component further comprises an optical detector having a polarisation detector, said optical detector being configured to measure the emission and polarisation of photons output from said component.

In one embodiment, the voltage controller is configured to apply the same field to read out the state as to initialise the state. In a further embodiment, these fields are different.

The lower the fine structure splitting the slower the precession of the superposition state. If the state precesses slowly, then it is easier to determine the state at any specific time. In an embodiment, the voltage controller is configured to maintain the fine structure splitting below 10 µeV for the initialisation, store and readout process.

In a further embodiment, the first layer, barrier layer and second layer are fabricated by a semiconductor growth technique such that the second quantum dot is formed after the first quantum dot and wherein the first contact is an n-type contact. In a further embodiment the second contact is a p-type contact. In a further embodiment the second contact is a Schottky contact.

By forming the n-type contact on the base of the device, it is possible to apply an electric field pointing from the bottom to the top quantum dot, here defined as a negative electric field, and thereby reduce the fine structure splitting.

In an embodiment, the memory is configured to output the same qubit state which is read into the memory. In such an embodiment, the acquiring circuit is configured to acquire the exciton fine structure splitting for the electric field applied during the qubit storage. The timing circuit is configured to move said exciton to the readout configuration once the qubit state has completed an integer number of revolutions around the elgenstate axis, such that the voltage controller allows the qubit state as initialised to be readout.

In a further embodiment, the acquiring circuit is configured to acquire the fine structure splitting and eigenstate orientation for the applied electric field and the timing circuit is configured to move said exciton to the readout configuration once the qubit state has completed an integer number of revolutions around the elgenstate axis in addition to a predefined rotation from its original state, such that said voltage controller performs a quantum operation.

In an embodiment, it is also possible to change the eigenstates during the storage of the qubit by applying an appropriate electric field. Quantum operations where the qubit is rotated around two different axes on the Bloch sphere can thereby be performed.

In an embodiment, the voltage controller is configured to apply a modulated electric field adapted to alternate between two orthogonal eigenstate axes during qubit storage, thereby enabling the action of a "spin echo" to rephase the stored state.

In an embodiment, the exciton energy is different in the two quantum dots.

In a further embodiment, a method of storing a qubit state is provided, said qubit state being stored as an exciton spin state in a quantum dot molecule said exciton comprising an electron and hole bound state, said molecule comprising a first quantum dot provided in a first layer and a second quantum dot provided in a second layer, the first and second layers being separated by a barrier layer, the second layer being arranged above the first layer;

the method comprising:

applying an electric field adapted to allow an exciton in said quantum dot molecule to be moved from a direct configuration to an indirect configuration, wherein in the direct configuration the electron and hole are located in one of the quantum dots and in the indirect configuration, the electron of said exciton is located in one quantum dot and the hole of said exciton in the other quantum dot, acquiring information concerning the relationship between the fine structure splitting of an exciton in said quantum dot molecule and the applied electric field, applying a further electric field configured to move the exciton from the indirect configuration to the direct configuration at a predetermined time, wherein the predetermined time is derived from the fine structure splitting.

In an embodiment, the method comprises:

a first electric field across the quantum dot molecule when an exciton is initialised in the quantum dot molecule in the direct configuration, wherein during initialisation the exciton is created in the quantum dot;

a second electric field across the quantum dot molecule, wherein at this field, the lowest energy exciton state corresponds to the indirect exciton configuration; and a third electric field across the quantum dot molecule, configured to allow readout of the quantum information stored in the spin state of the exciton, wherein at said third electric field the lowest energy exciton state corresponds to the direct exciton configuration.

FIG. 1 is a schematic of a memory component in accordance with an embodiment of the present invention.

As used herein, the following the terms 'above' and 'below' are defined with respect to the order of growth of the layers, a layer grown at an early point in time is defined to be below a layer grown at a later point in time.

The component has a quantum dot molecule which comprises two quantum dots separated by a barrier layer.

A quantum dot layer 1 is provided overlying and in contact with undoped region 11. In this specific example, the quantum dot layer 1 is fabricated by growing a few monolayers of $In_xGa_{1-x}As$, with x=0.2-1.0 on a GaAs or AlGaAs layer. Due to the differences in lattice constant between the quantum dot layer 1 and the underlying layers, the quantum dot layer forms islands and these islands are the quantum dots 3. Overlying and in contact with said quantum dot layer 1 is un-doped barrier layer 9 of $Al_xGa_{1-x}As$, with x=0.0-0.9, the thickness of the barrier is 1-30 nm.

Overlying and in contact with said barrier layer 9 is second quantum dot layer 5. Second quantum dot layer 5 is also fabricated by growing a few monolayers of $In_xGa_{1-x}As$, with x=0.2-1.0. Due to the differences in lattice constant between the quantum dot layer 5 and the barrier layer 9, the quantum dot layer 5 forms islands and these islands are the quantum dots 7. As quantum dot layer 5 is formed after the first quantum dot layer 1, and a relatively thin barrier layer 9, the quantum dots 7 in the second quantum dot layer align with the quantum dots 3 in the first quantum dot layer 1 due to strain assisted nucleation, the quantum dots in the two layers thereby align to form quantum dot molecules.

The first quantum dot layer is located on an undoped layer of $Al_xGa_{1-x}As$ 11, with composition x=0.0-0.9, the undoped layer has a thickness of more than 10 nm. An n-type doped layer 10 is located below the undoped layer 11 of $Al_xGa_{1-x}As$.

An undoped layer 13 of $Al_xGa_{1-x}As$ 11, with composition x=0.0-0.9 and thickness larger than 10 nm, is formed overlying the second quantum dot layer. A p-type doped layer 14 is located above the undoped layer 13.

Electrical contacts 17 and 19 are connected to the n-type 10 and p-type 14 layers respectively so that a vertical electric field may be applied across the quantum dot molecule using a voltage source 26.

A voltage controller 21 is used to modulate the vertical electric field. The voltage controller comprises an acquisition circuit 23 and a timing circuit 25.

The polarisation quantum state of a photon is mapped onto the spin state of an exciton confined in the quantum dot molecule 3, 7 and the qubit is thereby initialised. The photons originate from an excitation source 51 which can be e.g. a laser, a single quantum dot or another quantum dot molecule. Quantum operations can be performed on the photons using one or several waveplates 53 to create the state that the operator wants to transcribe to the quantum memory. A lens 55 is used to focus the light onto the memory component.

A controller 21 modulates the exciton fine-structure and thereby controls the evolution of the exciton qubit during storage. The controller 21 also modulates the exciton lifetime and thereby controls the storage time of the qubit using timing circuit 25. The voltage modulator is used to change the electric field across the quantum dot molecule. The timing circuit 25 is used to regulate the voltage modulator so that the electric field across the quantum dot molecule is switched at precise moments in time which depends on the evolution of the qubit and the quantum operation the operator intends to perform. The timer is synchronised with the excitation source and in the following time t=0 is defined as the time when the exciton qubit is initialised. The timing circuit calculates the correct time to switch the voltage by reference to data acquired by the acquiring circuit 23.

When the quantum memory is read out the exciton spin-state is mapped back onto a photon polarisation state. The photons emitted from the quantum dot molecule are collected by a lens 61 and they can thereafter be used to communicate with a distant quantum memory or be measured directly. A beam steering device is used to direct the photons along path 71 if they are to be measured or along path 73 if they are to be used to communicate with a distant quantum memory. Path 73 leads to a distant quantum memory. If the photons are measured a waveplate 63 and a linear polariser 65 in front of a single photon detector 67 (e.g. an avalanche photodiode or a superconducting single photon detector) are used to make a projective measurement in one of the three bases; $|D\rangle$ and $|A\rangle$, $|L\rangle$ and $|R\rangle$, or $|H\rangle$ and $|V\rangle$. The detector 67 is synchronised with the timing circuit 25. The operator thus knows the exact storage time of the exciton qubit and can deduce the evolution of the qubit during this time.

Figure 2A:
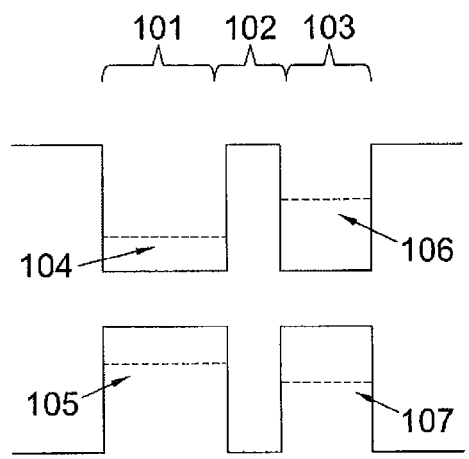
FIGS. 2(a) and 2(b) are schematic band diagrams of a quantum dot molecule.
Figure 2B:
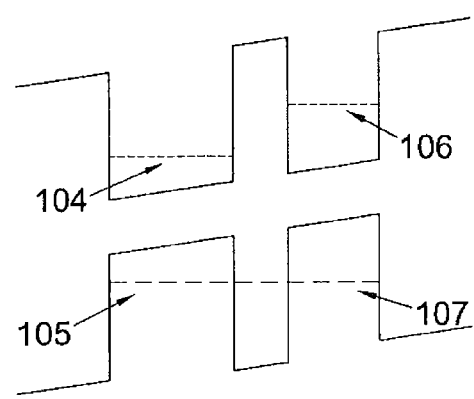

FIG. 2(a) is a schematic band diagram of a quantum dot molecule, of the type described with reference to FIG. 1, when the electric field across (denoted F) the quantum dot molecule is zero. The quantum dot molecule comprises a first quantum dot 101 and a second quantum dot 103, separated by a barrier 102. Quantum dot 101 has a lowest confined electron energy level 104 in the conduction band and a highest confined hole level 105 in the valence band. Quantum dot 103 has a lowest confined electron energy level 106 in the conduction band and a highest confined hole level 107 in the valence band. The two quantum dots are of different size and therefore have different confinement energies. At a specific electric field $F_{AC}$ either the electron or hole ground states of the two quantum dots come into resonance and the two quantum dots tunnel-couple. FIG. 2 (b) is a schematic band diagram of a quantum dot molecule, of the type described with reference to FIG. 1, when the electric field across the quantum dot molecule is $F_{AC}$ and the two hole states are in resonance. Whether the electron or hole states come into resonance depends on the relative sizes of the quantum dots and the direction of the electric field. In the following description devices which have hole tunnelling resonances are used to exemplify the invention. However, electron tunnelling devices can also be used.

FIG. 3 schematically shows the band diagram of the quantum dot molecule during operation of the device. The polarisation of a photon is transcribed into the spin state of an exciton confined in the quantum dot molecule. The exciton comprises an electron 201 and a hole 202. The electron occupying energy level 104 or 106, or a tunnel-coupled state between the two. The hole occupying energy level 105 or 107, or a tunnel-coupled state between the two. The exciton energy is defined as the energy difference between the electron and hole energy. Clearly the exciton can have four different energy configurations; electron in 104 and hole in 105, electron in 104 and hole in 107, electron in 106 and hole in 105, or electron in 106 and hole in 107. The device operates using the lowest energy exciton configuration, which is the most stable one, at any given electric field.

Figure 3A:
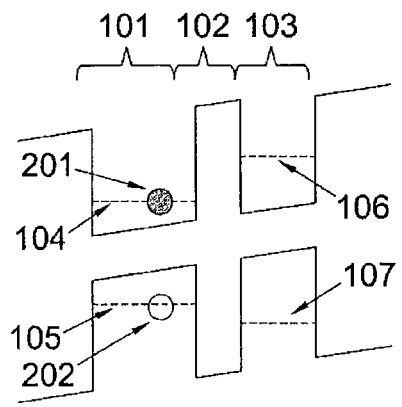
FIGS. 3(a) through 3(d) are schematic band diagrams of a quantum dot molecule during operation of the memory component.

FIG. 3(a) shows the band diagram of the quantum dot molecule during the initialisation phase. The electric field is $0<|F|<|F_{Cc}|$ so that the exciton with the lowest energy has both the electron and the hole confined in the same quantum dot, this is defined as the direct exciton state. The direct exciton configuration has a short lifetime, around 1 ns or below, and therefore easily absorbs a photon.

Figure 3B:
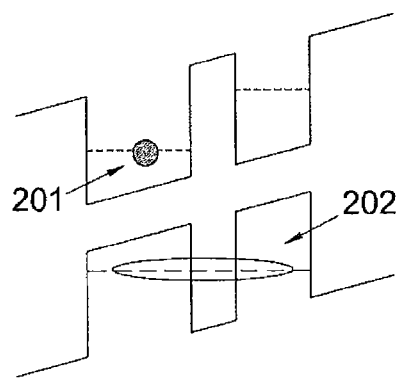

FIG. 3(b) shows the band diagram of the quantum dot molecule during the transition to the storage phase. The electric field is changed to $|F|=|F_{AC}|$ where the hole energy levels come into resonance and the hole is allowed to tunnel over. At this electric field the hole is delocalised and occupies both quantum dots at the same time.

Figure 3C:
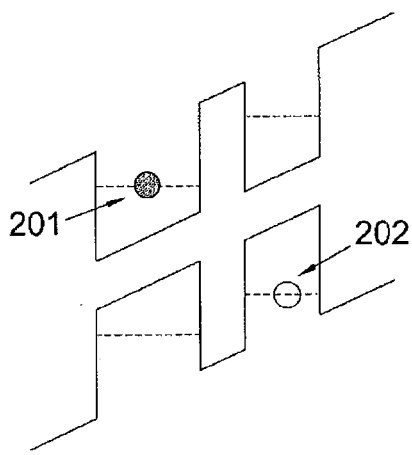

FIG. 3(c) shows the band diagram of the quantum dot molecule during the storage phase. The electric field is $|F|>|F_{AC}|$ so that for the lowest energy exciton state the electron and the hole are confined in separate quantum dots, this is defined as the indirect exciton configuration. This exciton configuration has a lifetime which is several orders of magnitude longer than the direct exciton configuration and the qubit can be stored for a few 100 ns.

Figure 3D:
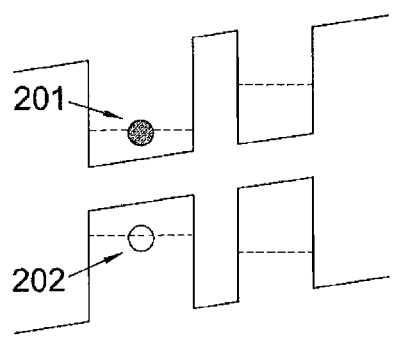

FIG. 3(d) shows the band diagram of the quantum dot molecule during the readout phase. The electric field is $0<|F|<|F_{AC}|$ so that the exciton returns to its direct configuration where the lifetime is short. The exciton subsequently recombines and emits a photon.

Figure 4A:
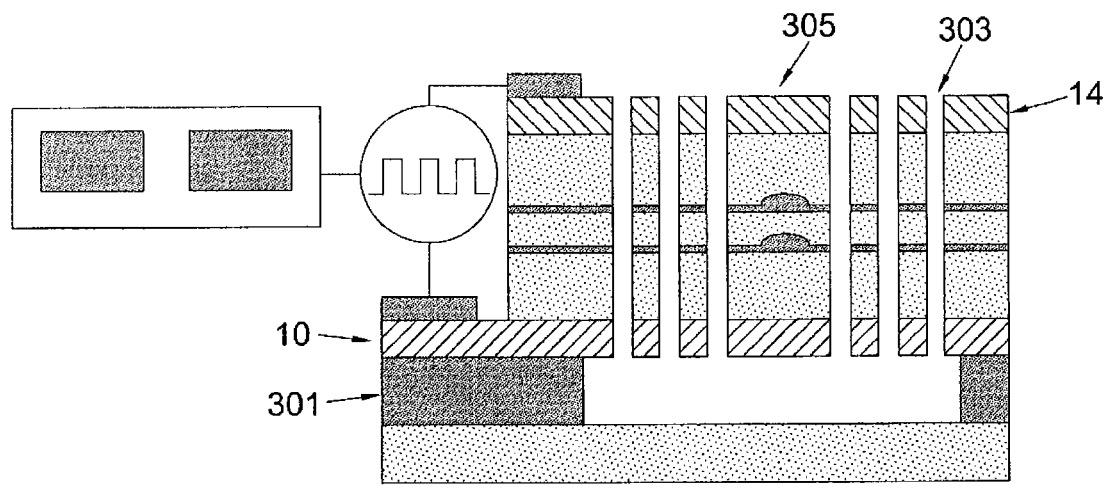
FIG. 4(a) is a schematic of a memory component in accordance with an embodiment of the present invention located in an optical cavity.

FIG. 4(a) shows of the quantum memory component in an optical cavity in accordance with an embodiment. To avoid any unnecessary repetition, like reference numerals will be used to denote like features. In this embodiment the cavity is a photonic crystal cavity.

Layer 10 is grown on top of a sacrificial layer 301 of $Al_xGa_{1-x}As$, with composition x=0.9-1.0. The photonic crystal is formed by etching a periodic pattern of holes 303 from the top of layer 14 and through all intermediate layers into sacrificial layer 301. Part of layer 301 is then selectively etched away so that the photonic crystal is suspended in a thin slab. One or several holes are intentionally not etched, the periodicity of the photonic crystal is thereby broken which forms an optical cavity 305.

The cavity is configured to enhance the efficiency of the initialisation and readout process. This is done by choosing the size and periodicity of the holes as well as the size of the cavity are so that optical mode of the cavity matches the light pulse from the excitation source 51 both in terms of frequency and spatial shape. Furthermore, the position of the cavity 305 is chosen so that the quantum dot molecule is placed in an anti-node. In this configuration the cavity will enhance the efficiency of the initialisation and readout process.

Figure 4B:
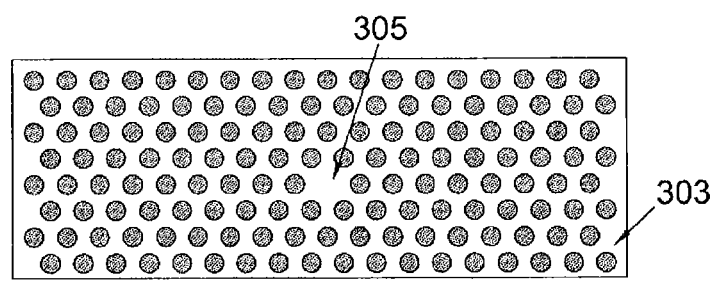
FIG. 4(b) shows a plan view of the component of FIG. 4(a) and FIG. 4(c) shows a variation of the component of FIG. 4(a)

FIG. 4(b) shows a top view of the photonic crystal structure shown in (a).

Figure 4C:
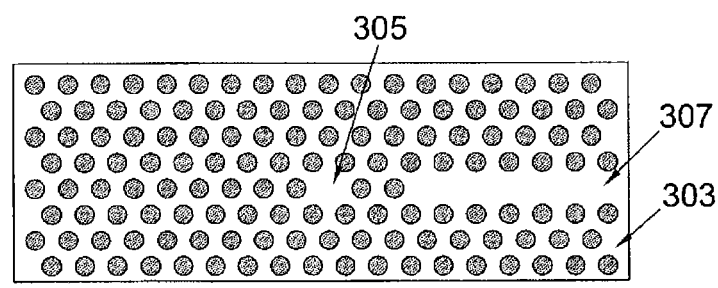

FIG. 4(c) shows a top view of a photonic crystal structure in a further embodiment, wherein a waveguide 307 is created in the photonic crystal by intentionally leaving a row of holes un-etched. The waveguide guides the light to and from the optical cavity 305. The waveguide can be connected to distant quantum dot molecules or to distant excitation sources or detectors.

The above embodiments provide a functional quantum memory as they allow control over the time evolution of a superposition state. A superposition state can be described as a point on the surface of the so called Bloch sphere of FIGS. 5 and 6. Two poles on the sphere define the eigenstates which are the only states that do not evolve in time. A superposition state, represented by any point on the Bloch sphere except for the eigenstates, will precess on the surface of the Bloch sphere around the axis defined by the two eigenstates. The period of this precession is inversely proportional to the fine-structure splitting.

In the above embodiments, a device structure is provided which minimises the fine-structure splitting in the operating bias range and a method for modulating both the fine-structure splitting and the eigenstate orientation on the Bloch sphere.

Figure 5:
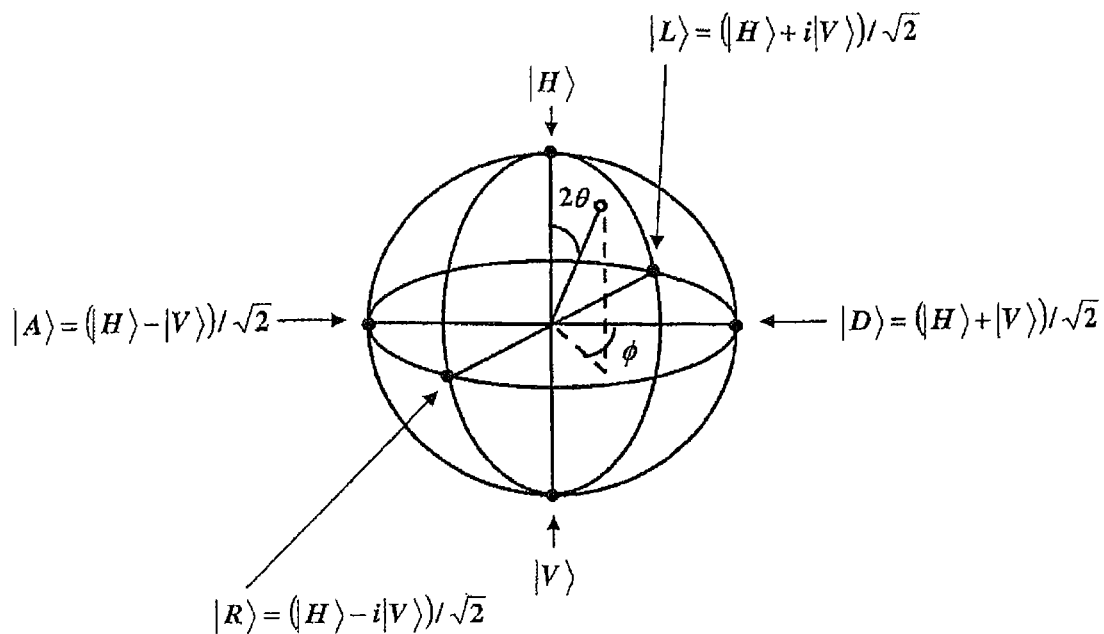
FIG. 5 is a Bloch sphere.

FIG. 5 is a Bloch sphere having eigenstates $|H\rangle$, and $|V\rangle$, which are the only states that do not evolve in time. For a self-assembled semiconductor quantum dot the eigenstates generally couple to light polarised along the [110] and [1-10] crystal axes, here annotated horizontally and vertically polarised light. FIG. 5 shows the Bloch sphere with the horizontally, $|H\rangle$, and vertically, $|V\rangle$, polarised states at the north- and south-pole respectively. An arbitrary qubit state can be expressed as a superposition of the eigenstates and represented by the angles $\theta$ and $\phi$ as defined in FIG. 5. The figure furthermore shows four specific superposition states, the diagonal, $|D\rangle$; anti-diagonal, $|A\rangle$; left hand circular, $|L\rangle$; and right hand circular $|R\rangle$, which all are orthogonal to the $|H\rangle$ and $|V\rangle$ states.

In contrast to the eigenstates a superposition state will evolve in time. It precesses on the surface of the Bloch sphere around the axis defined by the two eigenstates with a period (T) inversely proportional to the fine-structure splitting:

$$T = h/|S|$$

where h is Planck's constant and $|S|$ is the fine-structure splitting.

Figures 6A, 6B:
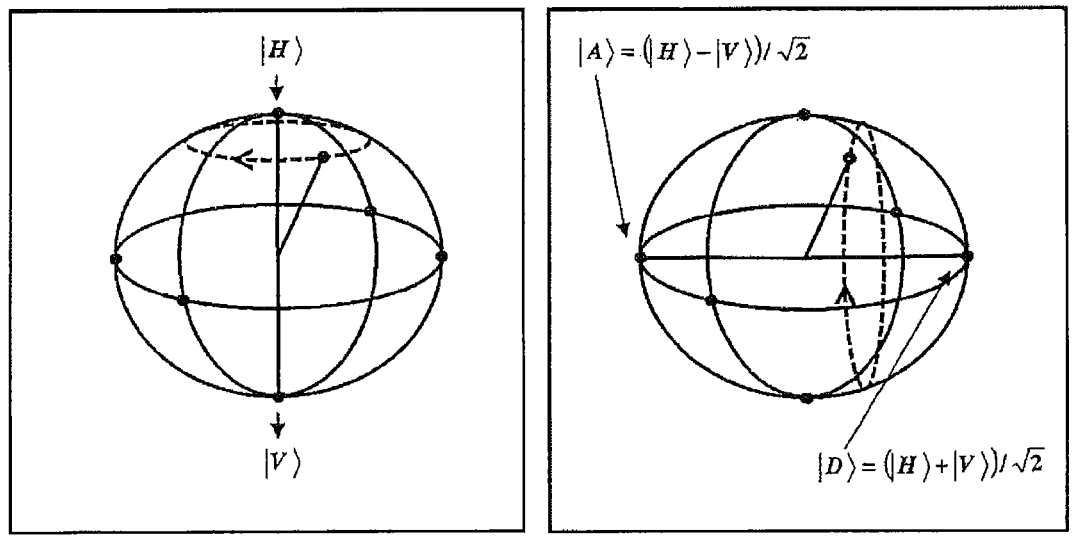
FIG. 6(a) is a Bloch sphere showing a quantum state precessing around the HV axis.
FIG. 6(b) is a Bloch sphere showing a quantum state precessing around the DA axis.

FIG. 6(a) shows a second Bloch sphere where $|H\rangle$ and $|V\rangle$ are eigenstates. The sphere also shows the precession of a superposition state around the $|H\rangle$ to $|V\rangle$ axis (denoted the HV axis). The precession of the superposition state is shown by the dashed line small circle.

FIG. 6(b) shows a second Bloch sphere where $|D\rangle$ and $|A\rangle$ are eigenstates. The precession of a superposition state around the $|D\rangle$ to $|A\rangle$ axis (denoted the DA axis) is again shown as a dashed line.

When the exciton is moved back to the direct configuration to be read out, the state may still precess. This will introduce some uncertainty to the measurement. This uncertainty is minimised by having a small fine structure splitting in the direct state (slow precession) and by minimising the exciton lifetime (fast recombination) in the direct state. Generally the lifetime is on the order of 1 ns but it can be reduced further by placing the quantum dot molecule in an optical cavity with a high Purcell factor.

The qubit state will evolve over time during storage. The operator can recreate the initial qubit state, if the readout is performed when the qubit has rotated an integer number of revolutions around the eigenstate axis on the Bloch sphere. In a further embodiment, quantum operations can be performed on the qubit during storage by controlling the orientation of the eigenstate axis and allowing the qubit to rotate a non integer number of revolutions around said axis.

In an embodiment, to aid control over the created state T is sufficiently long as compared to the timescale on which the electric field across the quantum dot molecules can be controlled. For example, this may be achieved if the fine-structure splitting is below 10 µeV at all times during the qubit initialisation, store and readout processes.

The exciton eigenstates have a reduced fine-structure splitting in the indirect exciton configuration as compared to the direct exciton configuration. FIGS. 7(a) and 7(c) also show that the fine-structure splitting in the direct exciton configuration increases with increasing electric field, where the direction of the electric field is defined to point from the top to the bottom quantum dot. FIG. 7(a) shows the exciton energy spectrum and the fine-structure splitting, |S|, as a function of electric field for a quantum dot molecule operating at negative electric fields, only the two lowest energy exciton configurations are presented for clarity. The higher energy branch of the exciton spectrum in the figure is represented by dotted lines while the lower energy branch is represented by solid lines. The so called anti-crossing which separates the two energy branches of the spectrum marks the resonance where the two quantum dots couple, it occurs at the electric field $F_{AC}$ and marks the transition from the direct to indirect exciton configuration. FIG. 7(b) schematically shows the band structure of the quantum dot molecule presented in (a) at the resonance. FIG. 7(c) shows the exciton energy spectrum and the fine-structure splitting as a function of electric field for a quantum dot molecule operating at positive electric fields. FIG. 7(d) schematically shows the band structure of the quantum dot molecule presented in (c) at the resonance.

FIGS. 7(a) and (c) shows that |S| is minimised when a negative electric field is applied. A negative electric field can be applied by placing the quantum dots in a p-i-n diode structure with the n-type contact below the quantum dots and the p-type contact above. Alternatively a negative electric field can be applied by placing the quantum dots in a n-i-Schottky diode with an n-contact below the quantum dots.

In an embodiment, the dots are not identical. Identical dots have their resonance (the anti crossing) at F=0. F=0 is the point where electrons and holes are injected from the contacts. When the bottom contact is n it is possible to apply fields F<0 without injecting charge carriers. When the bottom contact is p it is possible to apply fields F>0 without injecting charge carriers. Whichever configuration is chosen, it is desirable to stay well away from the point where carrier injection begins.

When the quantum dots are grown with the same growth time, the top dot is generally larger. However, the dot sizes may be controlled when the quantum dot molecule is grown so that the bottom dot is always larger. This allows choice over the configuration of the quantum dot molecule. For example, the bottom dot bigger/top dot bigger together with the choice of doping bottom contact n/top contact n, in total 4 alternatives. In the above embodiments, the bottom dot is the bigger dot together with bottom contact n. However, the other configurations discussed above are all possible.

Figure 7:
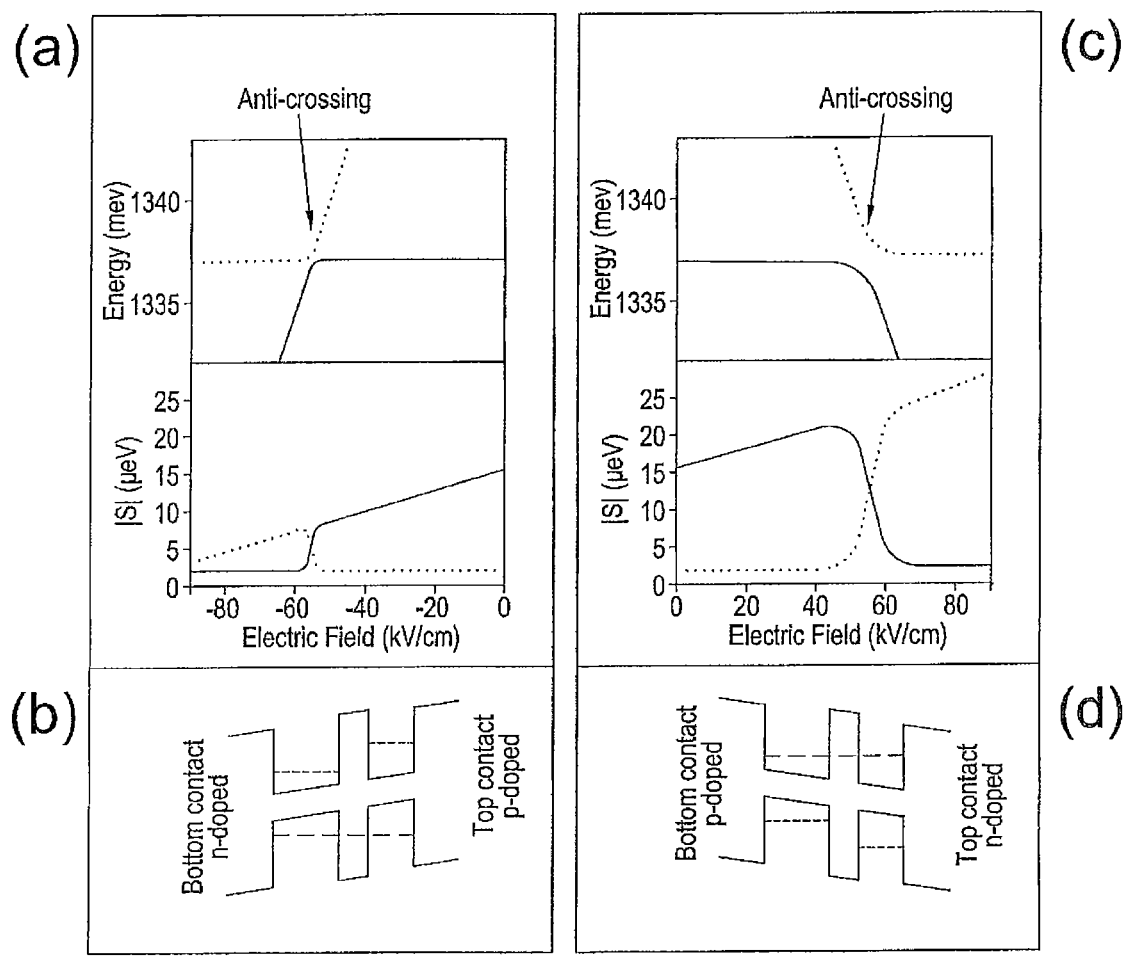
FIG. 7(a) is a plot of energy and fine structure splitting against applied electric field for the quantum dot molecule with a band diagram schematically shown in FIG. 7(b)
FIG. 7(c) is a plot of energy and fine structure splitting against applied electric field for the quantum dot molecule with a band diagram shown in FIG. 7(d)

The size of the quantum dots, together with the composition and strain of the quantum dots, determines which charge carrier tunnels over, in FIG. 7 (b) holes tunnel and in 7 (d) electrons tunnel.

The direct exciton forms in the biggest quantum dot (assuming that the composition and strain is the same for the two quantum dots). It is possible to form an exciton in the smallest dot but it will have a higher energy and will naturally strive to relax to the low energy state. For this reason the following embodiments relate to the lowest energy state.

Figure 8A:
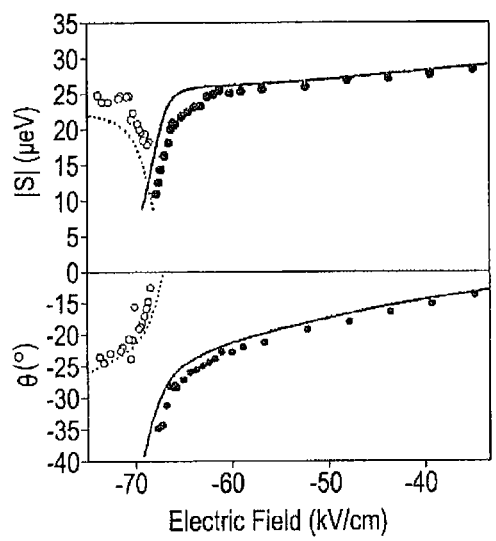
FIG. 8(a) is a plot of the experimentally measured fine structure splitting and eigenstate orientation against electric field for a first quantum dot molecule and FIG. 8(b) is a plot of the experimentally measured fine structure splitting and eigenstate orientation against electric field for a second quantum dot molecule.
Figure 8B:
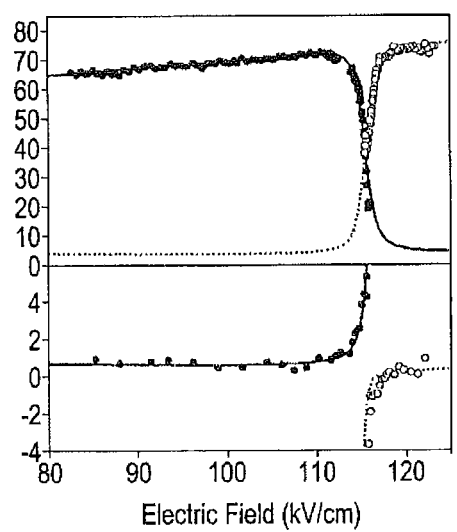

FIGS. 8 (a) and (b) represent experimental data, the figures characterise the eigenstates as a function of electric field for two different quantum dot molecules operating at negative and positive electric fields respectively. The top panels presents |S| and the bottom panels presents the orientation of the eigenstate axis on the Bloch sphere in terms of θ, for these measurements □=0. These figures show that for some quantum dot molecules the eigenstates rotate at the transition from the direct to the indirect configuration. The rotation of the eigenstates is a consequence of coupling between dissimilar spin states in the direct and indirect exciton configuration.

Figure 9:
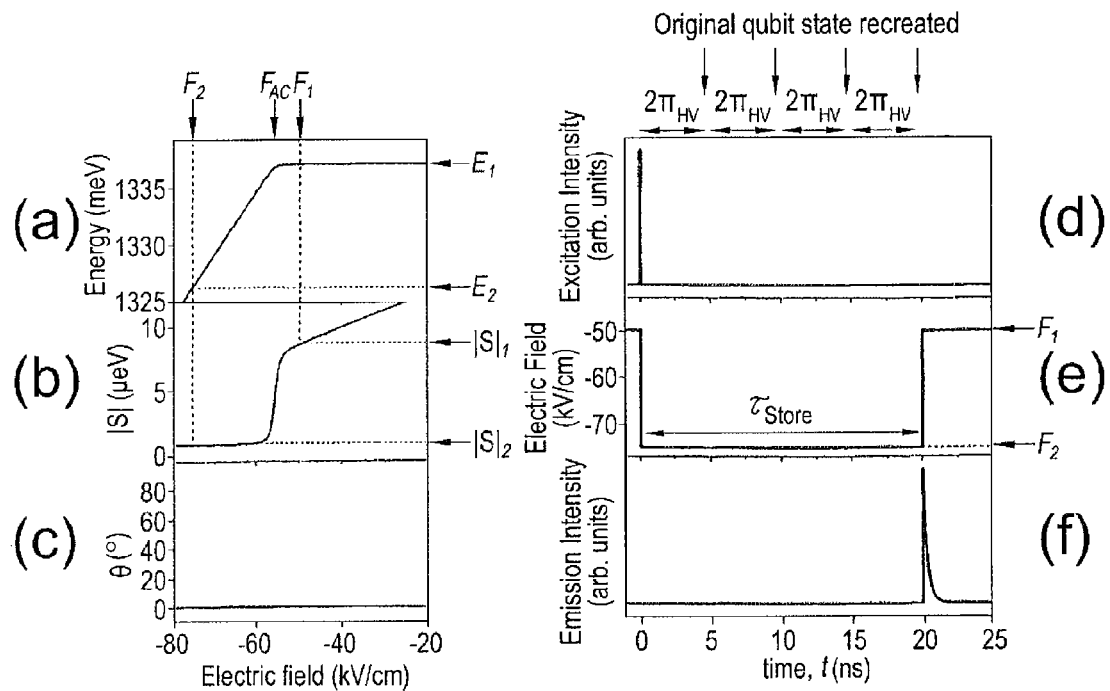
FIG. 9(a) is a plot of the energy spectrum for the lowest energy exciton configuration against applied electric field.
FIG. 9(b) is a plot of the fine structure splitting against applied electric field and FIG. 9(c) is a plot of the orientation of the eigenstates of the exciton against applied electric field.
FIG. 9(d) is a plot of excitation intensity over time.
FIG. 9(e) is a plot of the applied electric field over time and FIG. 9(f) is a plot the corresponding emission intensity over time to demonstrate recreation of a state originally initialised in a quantum dot molecule.

FIGS. 9(a),(b) and (c) show the energy spectrum, |S| and θ respectively for an exciton confined in a quantum dot molecule structure against electric field. Only the lowest energy branch of the exciton spectrum is shown and the high energy branch is omitted from the figure for clarity. The electric field at which the anti-crossing occurs is marked $F_{AC}$ in the figure. For fields below $F_{AC}$ the exciton is its indirect configuration and for fields above $F_{AC}$ the exciton is its direct configuration. An electric field $F_1$, which puts the exciton in its direct configuration, is used for the initialisation and readout process. An electric field $F_2$, which puts the exciton in its indirect configuration, is used for the storage process. At these two electric fields, and any field in between, the fine-structure splitting, $|S|_1$ and $|S|_2$, is smaller than 10 µeV.

FIGS. 9(d), (e) and (f) demonstrate a method in accordance with an embodiment of the present invention for storing a qubit with no quantum operations performed. FIG. 9(d) shows the excitation intensity applied to the quantum dot molecule over time, FIG. 9(e) the electric field applied across the quantum dot molecule over time and 9(f) the emission intensity from the quantum dot molecule over time. At time t=0 the electric field applied across the quantum dot molecule is $F_1$ and a light pulse creates an exciton in its direct configuration. The light pulse originates from a laser or a quantum light source, e.g. a quantum dot or a quantum dot molecule, and has an energy equal to the exciton energy, $E_1$, or equal to the exciton energy plus an integer number of phonon energies. Immediately after the excitation light pulse the electric field is changed to $F_2$ and the exciton is stored in its indirect configuration. During the storage time the qubit precesses and the qubit rotates a full revolution around the HV axis (marked $2\pi_{HV}$ in the figure) with time intervals $\Delta t=h/|S|_2$. In the figure $h/|S|_2=5$ ns and thus the original state is recreated every $5^{th}$ ns (times when the original state is recreated are also marked in the figure). The storage time, $\tau_{Store}$, is set to:

$$\tau_{Store} = n \cdot \frac{h}{|S|_2}$$

where n is an integer. Consequently, the qubit rotates an integer number of revolutions and recreates it original state at the end of the storage time.

At t=$\tau_{Store}$ the electric field is changed back to $F_1$ and the exciton is returned to its direct configuration where it subsequently recombines to recreate a photon with the same quantum state as the original one.

Figure 10:
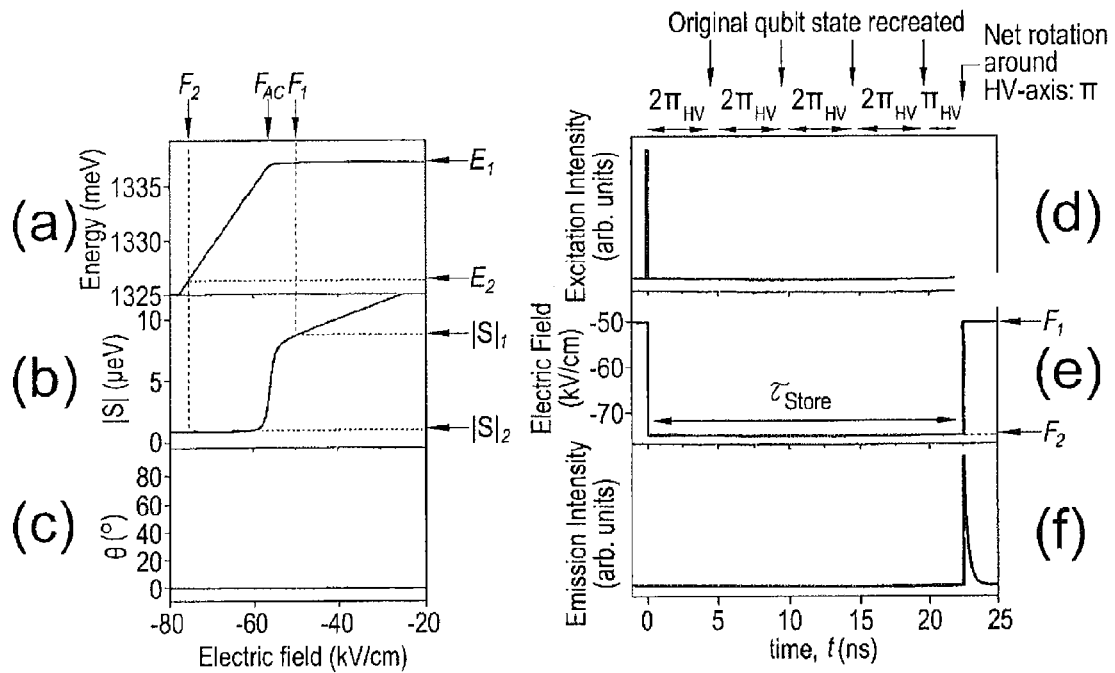
FIG. 10(a) is a plot of the energy spectrum for the lowest energy exciton configuration against applied electric field.
FIG. 10(b) is a plot of the fine structure splitting against applied electric field and FIG. 10(c) is a plot of the orientation of the eigenstates of the exciton against applied electric field.
FIG. 10(d) is a plot of excitation intensity over time.
FIG. 10(e) is a plot of the applied electric field over time and FIG. 10(f) is a plot the corresponding emission intensity over time to demonstrate recreation of a state with a net rotation around the HV axis of π from the state originally initialised in a quantum dot molecule.

FIGS. 10(a),(b) and (c) shows the energy spectrum, |S| and θ respectively for an exciton confined in a quantum dot molecule structure against electric field. FIGS. 10 (d), (e) and (f) demonstrate a method in accordance with an embodiment of the present invention for storing a qubit with a quantum operation performed. FIG. 10(d) shows the excitation intensity applied to the quantum dot molecule over time, FIG. 10(e) the electric field applied across the quantum dot molecule over time and 10(f) the emission intensity from the quantum dot molecule over time. In this embodiment a quantum operation, in which the qubit is rotated around the "|H⟩ to |V⟩ axis", is performed during storage. Just as in FIG. 9 the qubit state at f=0 is recreated at times $$t = n \cdot \frac{h}{|S|_2}$$

A rotation ϕ (measured in radians) around the axis defined by the eigenstates at electric field $F_2$, here the |H⟩ to |V⟩ axis, is performed by storing the qubit for a time $$\tau_{Store} = n \cdot \frac{h}{|S|_2} + \frac{\varphi}{2\pi} \cdot \frac{h}{|S|_2}$$

In FIG. 10 $\tau_{Store}$=4.5*h/|S|$_2$ giving a net rotation of π around the HV axis. Obviously, the qubit can be rotated any angle around the HV axis.

Figure 11:
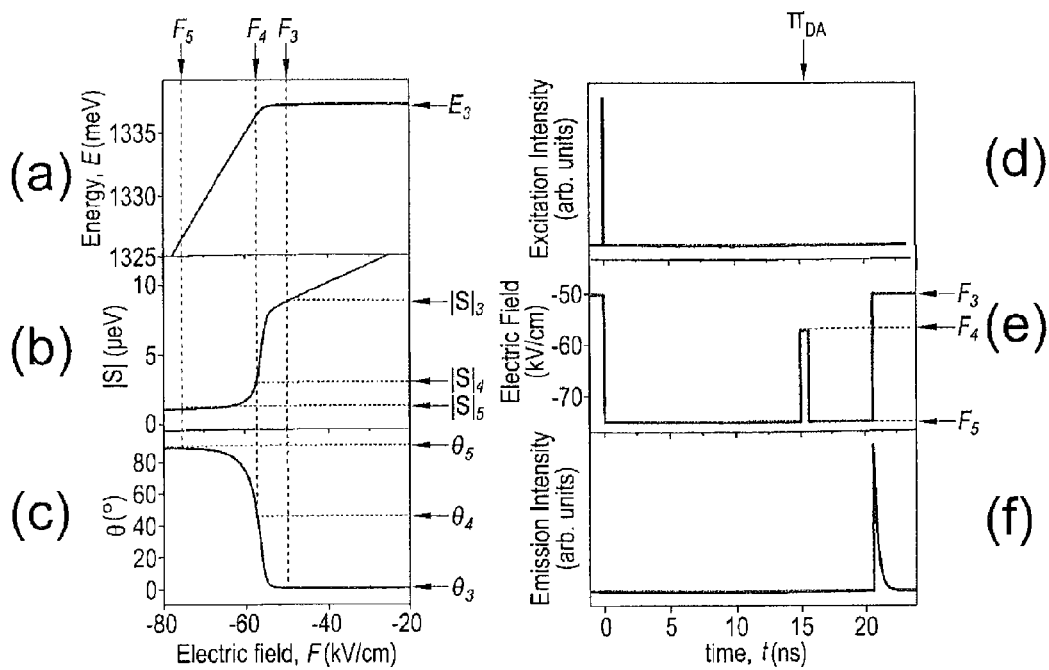
FIG. 11(a) is a plot of the energy spectrum for the lowest energy exciton configuration against applied electric field.
FIG. 11(b) is a plot of the fine structure splitting against applied electric field and FIG. 11(c) is a plot of the orientation of the eigenstates of the exciton against applied electric field.
FIG. 11(d) is a plot of excitation intensity over time.
FIG. 11(e) is a plot of the applied electric field over time and FIG. 11(f) is a plot the corresponding emission intensity over time to demonstrate recreation of a state with a net rotation around the DA axis of π from the state originally initialised in a quantum dot molecule.

FIGS. 11(a),(b) and (c) shows the energy spectrum, |S| and θ respectively for an exciton confined in a quantum dot molecule structure against electric field. FIGS. 11 (d), (e) and (f) demonstrate a method in accordance with an embodiment of the present invention. FIG. 11(d) shows the excitation intensity applied to the quantum dot molecule over time, FIG. 11(e) the electric field applied across the quantum dot molecule over time and 11(f) the emission intensity from the quantum dot molecule over time. In this embodiment a quantum operation, in which the qubit is rotated around the "|D⟩ to |A⟩ axis", is performed during storage. This operation can be performed using a quantum dot molecule which eigenstates rotates at the transition from the direct to indirect exciton configuration.

At time t=0 the electric field applied across the quantum dot molecule is $F_3$ and a light pulse creates an exciton in its direct configuration. The light pulse originates from a laser or a quantum light source, e.g. a quantum dot or a quantum dot molecule, and has an energy equal to the exciton energy, $E_3$, or equal to the exciton energy plus an integer number of phonon energies. Immediately after the excitation light pulse the electric field is changed to $F_5$ and the exciton is stored in its indirect configuration. As the electric field is changed from $F_3$ to $F_5$, the eigenstates rotate. In this embodiment the rotation is θ=90°, meaning that the eigenstate axis is "|H⟩ to |V⟩" at both $F_3$ and $F_5$. At an intermediate electric field, $F_4$, the eigenstate axis is "|D⟩ to |A⟩". However, the switching is fast, faster than 100 ps, in relation to the evolution time and no significant rotation of the qubit occurs during switching. During storage the qubit precesses around the "|H⟩ to |V⟩" axis.

At any point in time the qubit state at that instance can be rotated an angle ϕ (measured in radians) around the "|D⟩ to |A⟩" axis by changing the electric field to $F_4$ for a time period of $$\tau_{DA} = \frac{\varphi}{2\pi} \cdot \frac{h}{|S|_4}$$

In FIG. 11 a π rotation around the DA axis is performed, marked $\pi_{DA}$ in the figure. Obviously, the qubit can be rotated any angle around the DA axis. Furthermore, the qubit can be rotated around any axis to which the eigenstates can be rotated.

Figure 12:
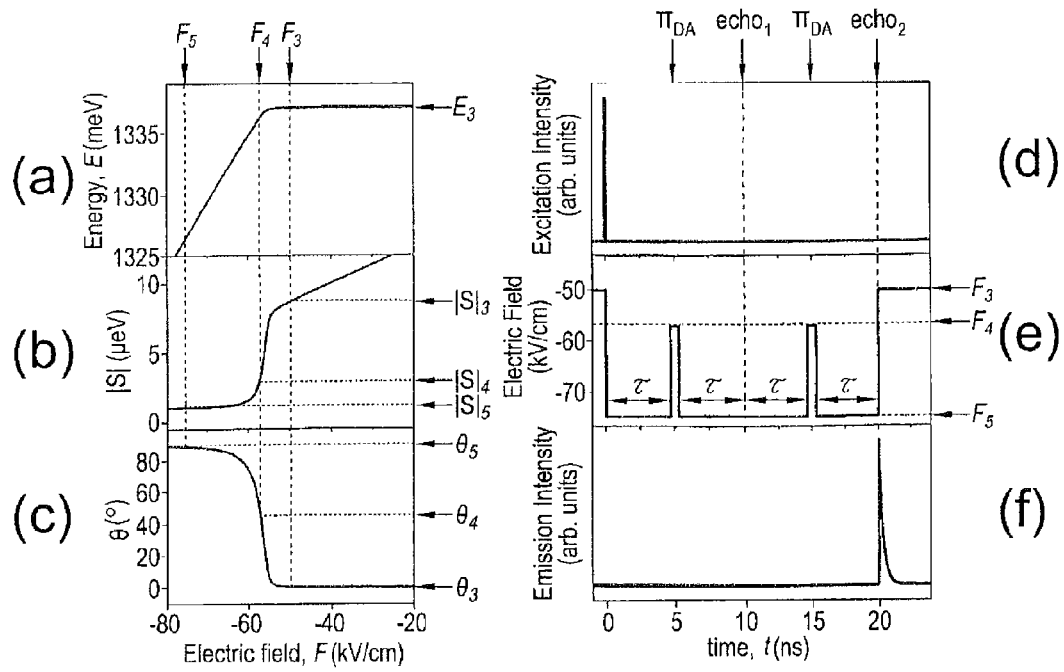
FIG. 12(a) is a plot of the energy spectrum for the lowest energy exciton configuration against applied electric field.
FIG. 12(b) is a plot of the fine structure splitting against applied electric field and FIG. 12(c) is a plot of the orientation of the eigenstates of the exciton against applied electric field.
FIG. 12(d) is a plot of excitation intensity over time.
FIG. 12(e) is a plot of the applied electric field over time and FIG. 12(f) is a plot of the corresponding emission intensity over time to demonstrate recreation of state after rephasing using the spin echo technique.

FIGS. 12(a),(b) and (c) shows the energy spectrum, |S| and θ respectively for an exciton confined in a quantum dot molecule structure against electric field. FIGS. 12 (d), (e) and (f) demonstrate a method in accordance with an embodiment of the present invention. FIG. 12(d) shows the excitation intensity applied to the quantum dot molecule over time, FIG. 12(e) the electric field applied across the quantum dot molecule over time and 12(f) the emission intensity from the quantum dot molecule over time. In this embodiment a spin-echo sequence is utilised in order to reduce dephasing of the qubit during storage. While a qubit is being stored it precesses around the eigenstate axis (here termed Z) and during this time a random dephasing also takes place. In quantum information processing this can be remedied by a spin-echo operation; After a time τ, during which dephasing takes place, the qubit is subjected to a π rotation around an axis (here termed X) which is orthogonal to Z. In terms of dephasing the π rotation has the effect that the qubit behaves as if it evolves backwards in time after the π rotation. An additional time period τ after the π rotation the qubit is refocused and recreates the original qubit state with minimal dephasing. Several spin-echo operations can be performed back-to-back during the qubit storage.

Spin-echo operations are generally implemented using an external magnetic field. The inventors have realised that the electrical controlled rotation of the eigenstate axis allows the operator to implement an all electrical spin-echo operation. In the embodiment in FIG. 12 the eigenstate axis is HV during the qubit storage. At time t=r a π rotation around the DA axis is performed resulting in a spin-echo (echo$_1$) at t=10 ns. The operation is subsequently repeated resulting in a second spin-echo (echo$_2$) at t=20 ns. At this time the qubit is read out.

The above embodiments provide a quantum memory component which encodes the polarisation quantum state of a photon into the spin state of an exciton wherein said quantum state is stored and manipulated.

In some embodiments, the photon used to create the exciton spin state has unknown polarisation. In quantum information processing (QIP), the state of the qubit is generally unknown. In the above embodiments an unknown qubit state can be rotated a predefined angle around a predefined axis on the Bloch sphere. This constitutes a quantum operation on the qubit.

The above embodiments provide a component comprising a quantum memory device for storing a qubit and a controller for manipulating said qubit. The quantum memory device comprises a quantum dot molecule and an excitation portion configured to produce a neutral exciton in said quantum dot molecule. The controller comprises a voltage source coupled to electrical contacts configured to apply a modulated electric field across the quantum dot molecule. By modulating the electric field the operator can modulate the exciton lifetime.

By modulating the electric field it is possible to switch between the direct exciton configuration, used for initialisation and readout of the qubit, and the indirect exciton configuration, used for storage of the qubit. Just as the electric field modulates the exciton lifetime it also modulates the exciton fine-structure splitting and the eigenstate orientation. This allows quantum operations to be performed on the stored qubit.

The above embodiments are scalable, meaning that a plurality of quantum memories can be constructed to handle a number of qubits simultaneously. The quantum memories can be controlled individually so that a specific quantum operation can be performed on a qubit stored in a specific quantum memory. Different qubits can also be subjected to the same operation. A specific qubit can also be transferred into a photon and sent off to be stored in a distant quantum memory or to interact with another photon from a distant quantum memory.

Components in accordance with the above embodiments are compatible with existing semiconductor technology. The quantum operations performed on the qubit are electrically controlled and do not require external equipment, e.g. magnets or tuneable lasers. The above embodiments are therefore capable of being scaled-up and mass-produced.

While certain embodiments have been described, these embodiments have been presented by way of example only, and are not intended to limit the scope of the inventions. Indeed the novel methods and systems described herein may be embodied in a variety of other forms; furthermore, various omissions, substitutions and changes in the form of methods and systems described herein may be made without departing from the spirit of the inventions. The accompanying claims and their equivalents are intended to cover such forms of modifications as would fall within the scope and spirit of the inventions.

The invention claimed is:

1. A component of a memory configured to store and manipulate a qubit state, said component comprising:
a quantum dot molecule, said molecule comprising a first quantum dot provided in a first layer and a second quantum dot provided in a second layer, the first and second layers being separated by a barrier layer, the second layer being arranged above the first layer;
an exciton comprising an electron and hole bound state in said quantum dot molecule, the spin state of said exciton forming said qubit;
a first electrical contact being provided below the first quantum dot and a second electrical contact being provided above the second quantum dot to allow an electric field to be provided across said quantum dot molecule;
a voltage source connected to the electrical contacts configured to apply an electric field across said quantum dot molecule,
a voltage source controller configured to modulate the electric field across the quantum dot molecule such that an exciton in the quantum dot molecule is switched between a direct configuration where the electron and hole of the exciton are in the same quantum dot and an indirect configuration wherein the electron and hole are located in different quantum dots of the quantum dot molecule, the voltage source controller comprising an information acquiring circuit and a timing circuit, the information acquiring circuit being configured to acquire information concerning the relationship between the fine structure splitting of said exciton and the applied electric field, the timing circuit being configured to allow switching of the exciton from an indirect configuration to a direct configuration at predetermined times derived from the fine structure splitting.

2. A component of a memory according to claim 1, wherein the first quantum dot, the barrier layer and the second quantum dot have been fabricated by a semiconductor growth technique such that the second quantum dot is formed after the first quantum dot and wherein the first contact is an n-type contact.

3. A component of a memory according to claim 2, wherein the second contact is a p-type contact.

4. A component of a memory according to claim 2, wherein the second contact is a Schottky contact.

5. A component according to claim 1, wherein the acquiring circuit is connected to a memory which contains data relating the fine structure splitting of said exciton to the applied electric field.

6. A component according to claim 1, further comprising an optical source, said optical source being configured to optically excite an exciton of known spin state in said quantum dot molecule.

7. A component according to claim 6, wherein said optical source is configured to have a photon energy which is an integer number of phonon energies greater than the lowest energy exciton state at the electric field adapted for qubit initialisation.

8. A component according to claim 6, wherein said optical source is configured to have a photon energy which is equal to the lowest energy exciton state at the electric field adapted for qubit initialisation.

9. A component according to claim 6, wherein said quantum dot molecule is located in an optical cavity so that;
the optical mode of the cavity matches the light pulse from the optical source both in terms of frequency and spatial shape,
the quantum dot molecule is positioned in an anti-node of the cavity.

10. A component according to claim 1, further comprising an optical detector having a polarisation detector, said optical detector being configured to measure the emission and polarisation of photons output from said component.

11. A component of a memory according to claim 1, wherein the exciton energy is different in the two quantum dots.

12. A component according to claim 1, wherein the voltage controller is configured to maintain the fine structure splitting below 10 µeV.

13. A component of a memory according to claim 1, wherein said voltage controller is configured to move said exciton from the indirect configuration to the direct configuration once the qubit state has completed an integer number of revolutions around the eigenstate axis such that the voltage controller allows the qubit state as initialised to be read-out, the timing circuit calculating the time to move the exciton to the direct configuration from the fine structure splitting.

14. A component according to claim 1, wherein said voltage controller is configured to move said exciton from the indirect configuration to the direct configuration once the qubit state has completed an integer number of revolutions around the eigenstate axis in addition to a predefined rotation from its original state, such that said voltage controller performs a quantum operation, the timing circuit calculating the time to move the exciton to the direct configuration from the fine structure splitting.

15. A component according to claim 1, wherein the information acquiring circuit being configured to acquire information concerning the relationship between the fine structure splitting of said exciton and the applied electric field as well as the eigenstate orientation on the Bloch sphere.

16. A component according to claim 1, wherein the voltage controller is configured to apply a modulated electric field adapted to change the eigenstates of the qubit for a finite time period at given points in time during qubit storage, thereby allowing the qubit to perform predefined rotations around two different eigenstate axes during storage.

17. A component according to claim 1, wherein the voltage controller is configured to apply a modulated electric field adapted to alternate between two orthogonal eigenstate axes during qubit storage, thereby enabling the action of a "spin echo" to rephase the stored state.

18. A component according to claim 1, wherein the voltage controller is configured to apply the same field to read out the state as to initialise the state.

19. A method of storing a qubit state, said qubit state being stored as an exciton spin state in a quantum dot molecule said exciton comprising an electron and hole bound state, said molecule comprising a first quantum dot provided in a first layer and a second quantum dot provided in a second layer, the first and second layers being separated by a barrier layer, the second layer being arranged above the first layer;

the method comprising:
applying a first electric field adapted to allow an exciton in said quantum dot molecule to be moved from a direct configuration to an indirect configuration, wherein in the direct configuration the electron and hole are located in one of the quantum dots and in the indirect configuration, the electron of said exciton is located in one quantum dot and the hole of said exciton in the other quantum dot, acquiring information concerning the relationship between the fine structure splitting of an exciton in said quantum dot molecule and the applied electric field, applying a further electric field configured to move the exciton from the indirect configuration to the direct configuration at a predetermined time, wherein the predetermined time is derived from the fine structure splitting.

20. A method according to claim 19, wherein the voltage source controller is adapted to apply:

a first electric field across the quantum dot molecule when an exciton is initialised in the quantum dot molecule in the direct configuration, wherein during initialisation the exciton is created in the quantum dot;

a second electric field across the quantum dot molecule, wherein at this field, the lowest energy exciton state corresponds to the indirect exciton configuration; and a third electric field across the quantum dot molecule, configured to allow readout of the quantum information stored in the spin state of the exciton, wherein at said third electric field the lowest energy exciton state corresponds to the direct exciton configuration.

* * * * *